United States Patent
Kondo et al.

(10) Patent No.: US 11,746,410 B2
(45) Date of Patent: Sep. 5, 2023

(54) HEAT TREATMENT APPARATUS HEATING SUBSTRATE

(71) Applicant: SCREEN Holdings Co., Ltd., Kyoto (JP)

(72) Inventors: Yasuaki Kondo, Kyoto (JP); Mao Omori, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 17/516,750

(22) Filed: Nov. 2, 2021

(65) Prior Publication Data

US 2022/0178015 A1    Jun. 9, 2022

(30) Foreign Application Priority Data

Dec. 7, 2020    (JP) ................................. 2020-202772

(51) Int. Cl.
  *C23C 14/54*    (2006.01)
  *C23C 14/50*    (2006.01)
  *C23C 14/24*    (2006.01)

(52) U.S. Cl.
  CPC ............ *C23C 14/541* (2013.01); *C23C 14/24* (2013.01); *C23C 14/50* (2013.01)

(58) Field of Classification Search
  None
  See application file for complete search history.

(56) References Cited

U.S. PATENT DOCUMENTS 10,249,487 B2    4/2019 Okutani et al.
2004/0115584 A1*    6/2004 Okabe ................. C23C 16/4401
                                                            118/715

(Continued)

FOREIGN PATENT DOCUMENTS

CN    110352265 A    10/2019
JP    09-000909 A    1/1997

(Continued)

OTHER PUBLICATIONS

First Office Action and Search Report dated Nov. 16, 2022 in corresponding Taiwanese Patent Application No. 110144953 and computer generated English translation thereof.

(Continued)

*Primary Examiner* — Shamim Ahmed
*Assistant Examiner* — Bradford M Gates
(74) *Attorney, Agent, or Firm* — OSTROLENK FABER LLP

(57)    ABSTRACT

A combustion-supporting gas line, a flammable gas line, and an inert gas line are connected to a chamber performing a heat treatment on a semiconductor wafer. Nitrogen is sent from the inert gas line to the combustion-supporting gas line before supplying flammable gas into the chamber to replace gas in the combustion-supporting gas line with nitrogen. Nitrogen is sent from the inert gas line to the flammable gas line before supplying combustion-supporting gas into the chamber to replace gas in the flammable gas line with nitrogen. Common one inert gas line is provided in the combustion-supporting gas line and the flammable gas line, thus a space for arranging components relating to gas supply can be reduced.

6 Claims, 5 Drawing Sheets

(56) References Cited

U.S. PATENT DOCUMENTS

| | | | |
|---|---|---|---|
| 2006/0223015 A1* | 10/2006 | Tsuge | C21D 11/00 |
| | | | 431/19 |
| 2011/0108128 A1 | 5/2011 | Kishimoto et al. | 137/12 |
| 2013/0078744 A1* | 3/2013 | Kiyama | H01L 21/02181 |
| | | | 438/5 |
| 2018/0337103 A1* | 11/2018 | Omori | H01L 21/67017 |

FOREIGN PATENT DOCUMENTS

| | | |
|---|---|---|
| JP | 2003-031507 A | 1/2003 |
| JP | 5274557 B2 | 8/2013 |
| TW | I667686 B | 8/2019 |
| TW | 202002082 A | 1/2020 |

OTHER PUBLICATIONS

Michael Quirk, Semiconductor Manufacturing Technology, Prentice-Hall 2001, 4 pages.

\* cited by examiner

F I G. 3
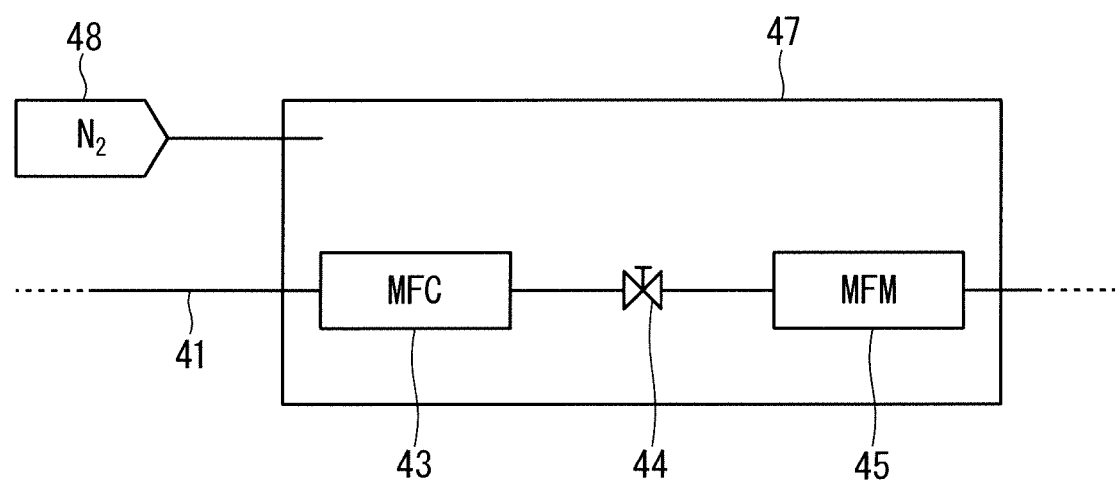

HEAT TREATMENT APPARATUS HEATING SUBSTRATE

BACKGROUND OF THE INVENTION

Field of the Invention

The present invention relates to a heat treatment apparatus heating a thin plate-like precision electronic substrate (hereinafter referred to simply as a "substrate") such as a semiconductor wafer in a flammable gas atmosphere or a combustion-supporting gas atmosphere.

Description of the Background Art

A heat treatment apparatus irradiating a semiconductor wafer with light to heat the semiconductor wafer is widely known as an apparatus manufacturing a semiconductor device. A heat treatment of the semiconductor wafer is performed in various types of gas atmosphere in such a heat treatment apparatus. For example, a light irradiation heating is performed on a semiconductor wafer in which a high-dielectric-constant film (a High-k film) is formed in an ammonia atmosphere to nitride the high-dielectric-constant film. A light irradiation heating is performed on a silicon semiconductor wafer in an oxygen atmosphere to form an oxide film. Furthermore, also performed in some cases is a nitriding treatment in an ammonia atmosphere consecutively after an oxidation treatment in an oxygen atmosphere or an oxidation treatment in an oxygen atmosphere consecutively after a nitriding treatment in an ammonia atmosphere.

However, ammonia is flammable gas and oxygen is combustion-supporting gas (combustion-aid gas). It is therefore dangerous to mix ammonia, which is the flammable gas, and oxygen, which is the combustion-supporting gas, in the apparatus when the oxidation treatment and the nitriding treatment are consecutively performed. Accordingly, for example, US 2011/0108128 discloses a technique of providing two valves in a gas supply line of each of the flammable gas and the combustion-supporting gas to supply inert gas therebetween. Japanese Patent Application Laid-Open No. 2003-31507 discloses a technique for individually exhausting flammable gas and combustion-supporting gas remaining in an apparatus to prevent the flammable gas and the combustion-supporting gas from being mixed and reacting with each other. Furthermore, Japanese Patent Application Laid-Open No. H09-909 discloses a technique of supplying inert gas to an exhaust tube to attenuate gas to prevent mixture of flammable gas and combustion-supporting gas in the exhaust tube.

It is an effective means to supply the inert gas to each gas supply line to prevent the mixture of the flammable gas and the combustion-supporting gas. However, when an inert gas supply line is individually provided for each of a flammable gas supply unit and a combustion-supporting gas supply unit, there is a problem that a space for arranging the gas supply units gets too large.

SUMMARY OF THE INVENTION

The present invention is intended for a heat treatment apparatus heating a substrate.

According to one aspect of the present invention, a heat treatment apparatus includes: a chamber housing a substrate; a heating part performing a heat treatment on the substrate housed in the chamber; a combustion-support gas line supplying combustion-support gas to the chamber; a flammable gas line supplying flammable gas to the chamber; and an inert gas line sending inert gas to the combustion-supporting gas line to replace gas in the combustion-supporting gas line with the inert gas and sending inert gas to the flammable gas line to replace gas in the flammable gas line with the inert gas, wherein the inert gas line is provided in the combustion-gas line and the flammable gas line in common.

Minimization of the inert gas line can be achieved and a space for arranging components relating to gas supply can be reduced.

Preferably, the heat treatment apparatus further includes: a comparison part comparing a total value of a flow rate of the flammable gas controlled by a second mass flow controller and a flow rate of the inert gas controlled by a third mass flow controller and a measurement value obtained by a mass flow meter; and an alarm activation part activating an alarm when the total value and the measurement value do not coincide with each other.

Abnormality in the mass flow controller can be appropriately detected.

Preferably, at least the second mass flow controller and the mass flow meter are housed in an enclosure, and nitrogen is supplied in the enclosure.

Fire or explosion of the flammable gas caused by an electrical mass flow controller and mass flow meter can be previously prevented.

Thus, the object of the present invention is to reduce the space for arranging the components relating to the gas supply.

These and other objects, features, aspects and advantages of the present invention will become more apparent from the following detailed description of the present invention when taken in conjunction with the accompanying drawings.

BRIEF DESCRIPTION OF THE DRAWING

FIG. 3 is a drawing illustrating an explosion-proof structure.

DESCRIPTION OF THE PREFERRED EMBODIMENTS

Embodiments according to the present invention will now be described in detail with reference to the drawings.

Figure 1:
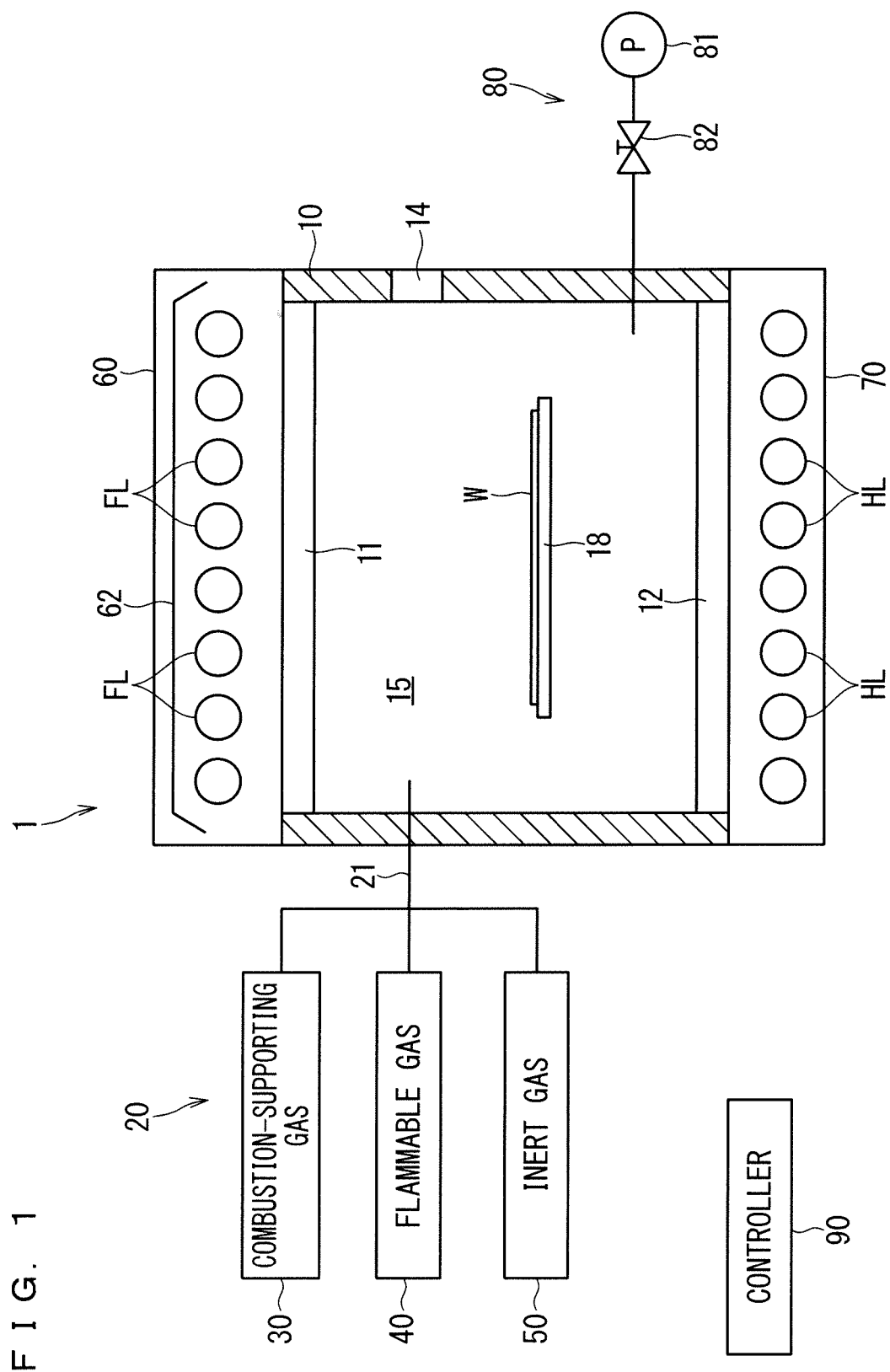
FIG. 1 is a drawing illustrating a configuration of a main part of a heat treatment apparatus according to the present invention.

FIG. 1 is a drawing illustrating a main configuration of a heat treatment apparatus 1 according to the present invention. The heat treatment apparatus 1 in FIG. 1 is a flash lamp annealer for heating a disk-shaped semiconductor wafer W serving as a substrate by irradiating the semiconductor wafer W with a flash of light. A size of the semiconductor wafer W to be treated is not particularly limited. For example, the semiconductor wafer W to be treated has a diameter of 300 mm or 450 mm. It should be noted that dimensions of components and the number of components are shown in exaggeration or in simplified form, as appropriate, in FIG. 1 and the subsequent drawings for the sake of easier understanding.

The heat treatment apparatus 1 includes a chamber 10 housing a semiconductor wafer W, a flash irradiation part 60 irradiating the semiconductor wafer W in the chamber 10 with a flash of light, a halogen irradiation part 70 irradiating the semiconductor wafer W with halogen light, a gas supply part 20 supplying treatment gas in the chamber 10, and an exhaust part 80 exhausting gas from the chamber 10. The heat treatment apparatus 1 includes a controller 90 controlling these components to make them execute the flash light irradiation.

The chamber 10 houses the semiconductor wafer W to be treated, and a heat treatment is performed on the semiconductor wafer W in the chamber 10. An upper chamber window 11 is attached to close an upper portion opening of the chamber 10, and a lower chamber window 12 is attached to close a lower portion opening of the chamber 10. A space surrounded by a sidewall of the chamber 10, the upper chamber window 11, and the lower chamber window 12 is defined as a heat treatment space 15. The upper chamber window 11 constituting a ceiling part of the chamber 10 is a plate-like member made of quartz, and serves as a quartz window that transmits a flash of light emitted from the flash irradiation part 60 therethrough into the heat treatment space 15. The lower chamber window 12 constituting a floor part of the chamber 10 is also a plate-like member made of quartz, and serves as a quartz window that transmits light emitted from the halogen irradiation part 70 therethrough into the heat treatment space 15.

The sidewall of the chamber 10 is provided with a transport opening 14 for transporting the semiconductor wafer W therethrough into and out of the chamber 10. The transport opening 14 is openable and closable by a gate valve not shown in the drawings. When the transport opening 14 is opened, the semiconductor wafer W can be transported into and out of the chamber 10 by a transportation robot located out of the drawings. When the transport opening 14 is closed, ventilation between the heat treatment space 15 and outside is blocked and the heat treatment space 15 is an enclosed space.

A susceptor 18 holding the semiconductor wafer W is provided in the chamber 10. The susceptor 18 is a disk-shaped member formed of quartz. A diameter of the susceptor 18 is a little larger than that of the semiconductor wafer W. The semiconductor wafer W is held in the chamber 10 in a horizontal posture (a posture in which a normal line direction of a main surface coincides with a vertical direction) by the susceptor 18.

The flash irradiation part 60 is provided on an upper side of the chamber 10. The flash irradiation part 60 includes a light source made up of a plurality of flash lamps FL and a reflector 62 provided to cover an upper side of the light source. The flash irradiation part 60 irradiates the semiconductor wafer W held by the susceptor 18 in the chamber 10 with a flash of light from the flash lamps FL via the upper chamber window 11 made of quartz to heat a surface of the semiconductor wafer W.

The plurality of flash lamps FL, each of which is a rod-like lamp having an elongated cylindrical shape, are arranged in a plane so that the longitudinal directions of the respective flash lamps FL are in parallel with each other along a main surface of the semiconductor wafer W held by the susceptor 18 (that is, in a horizontal direction). Thus, a plane defined by the arrangement of the flash lamps FL is also a horizontal plane.

Each of the flash lamps FL includes a cylindrical glass tube (discharge tube) containing xenon gas sealed therein and having positive and negative electrodes provided on both ends thereof and connected to a capacitor, and a trigger electrode attached to an outer peripheral surface of the glass tube. Because the xenon gas is electrically insulative, no current flows in the glass tube in a normal state even if electrical charge is stored in the capacitor. However, if high voltage is applied to the trigger electrode to produce an electrical breakdown, electricity stored in the capacitor flows momentarily in the glass tube, and xenon atoms or molecules are excited at this time to cause light emission. Such a flash lamp FL has a property of being capable of emitting extremely intense light as compared with a light source that stays lit continuously such as a halogen lamp HL because electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 62 is provided on an upper side of the plurality of flash lamps FL to wholly cover them. A fundamental function of the reflector 62 is to reflect the flash of light emitted from the plurality of flash lamps FL toward the heat treatment space 15. The reflector 62 is a plate made of an aluminum alloy. A surface of the reflector 62 (a surface which faces the flash lamps FL) is roughened by abrasive blasting.

The halogen irradiation part 70 is provided on a lower side of the chamber 10. The halogen irradiation part 70 includes a plurality of built-in halogen lamps HL. The halogen irradiation part 70 directs light from the lower side of the chamber 10 through the lower chamber window 12 toward the heat treatment space 15 to heat the semiconductor wafer W by means of the plurality of halogen lamps HL.

The plurality of halogen lamps HL, each of which is a rod-like lamp having an elongated cylindrical shape, are arranged in a plane so that the longitudinal directions of the respective halogen lamps HL are in parallel with each other along the main surface of the semiconductor wafer W held by the susceptor 18. Thus, a plane defined by the arrangement of the halogen lamps HL is also a horizontal plane. The plurality of halogen lamps HL may be arranged in two tiers of an upper tier and a lower tier in a lattice pattern.

Each of the halogen lamps HL is a filament-type light source which passes current through a filament disposed in a glass tube to make the filament incandescent, thereby emitting light. Gas prepared by introducing a halogen element (iodine, bromine and the like) in trace amounts into inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. Thus, the halogen lamps HL are continuous lighting lamps that emit light continuously for at least not less than one second.

The exhaust part 80 includes a vacuum pump 81 and an exhaust valve 82, and opens the exhaust valve 82 while activating the vacuum pump 81, thereby exhausting an atmosphere in the chamber 10. When the vacuum pump 81 exhausts the atmosphere in the heat treatment space 15 which is an enclosed space while the gas supply part 20 does not supply gas, pressure in the chamber 10 can be reduced to a vacuum atmosphere.

Figure 2:
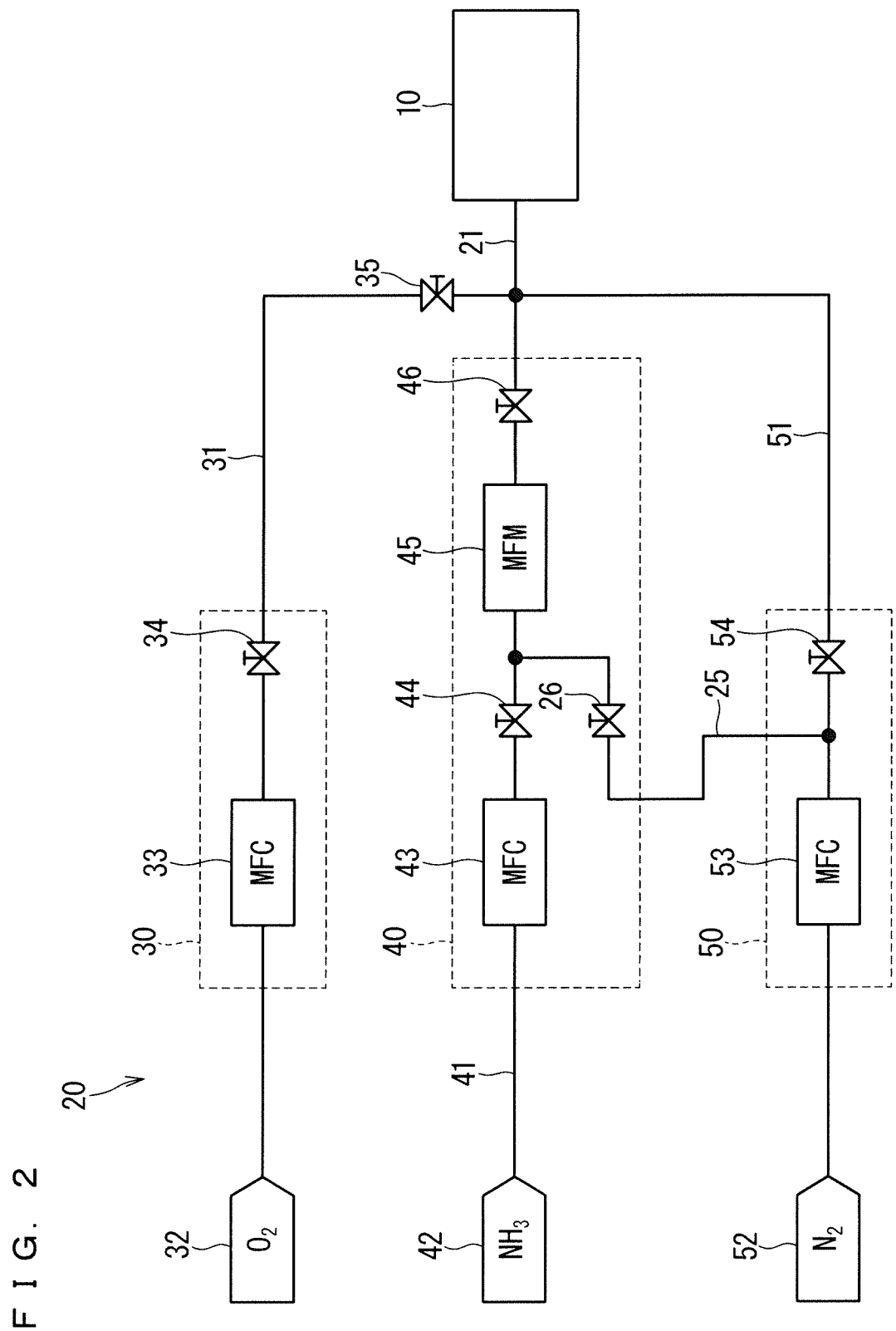
FIG. 2 is a drawing illustrating a gas supply part.

The gas supply part 20 includes three gas supply units of a combustion-supporting gas supply unit 30, a flammable gas supply unit 40, and an inert gas supply unit 50. FIG. 2 is a drawing illustrating a configuration of the gas supply part 20.

A gas supply line 21 is connected to the chamber 10. A side of base end of the gas supply line 21 is branched into three gas lines. That is to say, the three gas lines of the combustion-supporting gas line 31, the flammable gas line 41, and the inert gas line 51 are connected to the gas supply line 21. All of the combustion-supporting gas line 31, the flammable gas line 41, the inert gas line 51, and the gas supply line 21 are tubes for sending gas.

A tip end of the combustion-supporting gas line 31 is connected to the gas supply line 21, and the base end thereof is connected to an oxygen supply source 32. In the present embodiment, the combustion-supporting gas line 31 supplies oxygen ($O_2$) as the combustion-supporting gas to the chamber 10. A first mass flow controller 33, a valve 34, and a valve 35 are inserted in a midway portion of a route of the combustion-supporting gas line 31.

A tip end of the flammable gas line 41 is connected to the gas supply line 21, and a base end thereof is connected to an ammonia supply source 42. In the present embodiment, the flammable gas line 41 supplies ammonia ($NH_3$) as the flammable gas to the chamber 10. A second mass flow controller 43, a valve 44, a mass flow meter 45, and a valve 46 are inserted in a midway portion of a route of the flammable gas line 41.

A tip end of the inert gas line 51 is connected to the gas supply line 21, and a base end thereof is connected to a nitrogen supply source 52. The tip end of the inert gas line 51 is also connected to terminals ends of the flammable gas line 41 and the combustion-supporting gas line 31. In the present embodiment, the inert gas line 51 supplies nitrogen ($N_2$) as the inert gas. A third mass flow controller 53 and a valve 54 are inserted in a midway portion of a route of the inert gas line 51.

A bypass line 25 is branched in a midway portion of the route of the inert gas line 51 and connected to a midway portion of the route of the flammable gas line 41. The bypass line 25 is branched from a position in the route of the inert gas line 51 located on a downstream side in relation to the third mass flow controller 53. The bypass line 25 is connected between the second mass flow controller 43 and the mass flow meter 45 in the route of the flammable gas line 41. A valve 26 is inserted in a midway portion of a route of the bypass line 25.

The combustion-supporting gas supply unit 30 includes the first mass flow controller 33 and the valve 34 provided in the combustion-supporting gas line 31. The flammable gas supply unit 40 includes the second mass flow controller 43, the valve 44, the mass flow meter 45, and the valve 46 provided in the flammable gas line 41 and the valve 26 provided in the bypass line 25. The inert gas supply unit 50 includes the third mass flow controller 53 and the valve 54 provided in the inert gas line 51.

Each of the combustion-supporting gas supply unit 30, the flammable gas supply unit 40, and the inert gas supply unit 50 has a configuration in which a plurality of apparatuses such as a mass flow controller are incorporated into a plate-like member and integrated therein. Accordingly, a space for arranging components relating to gas supply can be reduced. In a precise sense, the second mass flow controller 43 and the mass flow meter 45 are not connected by a tube, for example, however, their connection state is substantially equal to the connection by the tube, thus in the present embodiment, they are deemed to be provided in the flammable gas line 41.

As illustrated in FIG. 3, an apparatus including at least the second mass flow controller 43 and the mass flow meter 45 is housed inside an enclosure 47. The enclosure 47 is filled with nitrogen supplied from a nitrogen supply part 48. The second mass flow controller 43 and the mass flow meter 45 are apparatuses activated by electricity, and may be ignition source. That is to say, if ammonia which is the flammable gas is leaked from a joint of the flammable gas line 41, for example, fire or explosion of the flammable gas may occur by a spark generated in the second mass flow controller 43 or the mass flow meter 45. In order to prevent this, at least the second mass flow controller 43 and the mass flow meter 45 are housed in the enclosure 47, and the enclosure 47 is filled with nitrogen. Flammable gas itself which is a burning material, an ignition source, and oxygen which is combustion-supporting gas, for example are necessary for the occurrence of fire or explosion. When the inner side of the enclosure 47 housing the second mass flow controller 43 and the mass flow meter 45 is filled with nitrogen, the combustion-supporting gas lacks, thus fire or explosion can be prevented. Nitrogen supplied from the nitrogen supply part 48 is supplied to prevent explosion, thus may have an impurity lower than nitrogen supplied from the nitrogen supply source 52.

Figure 4:
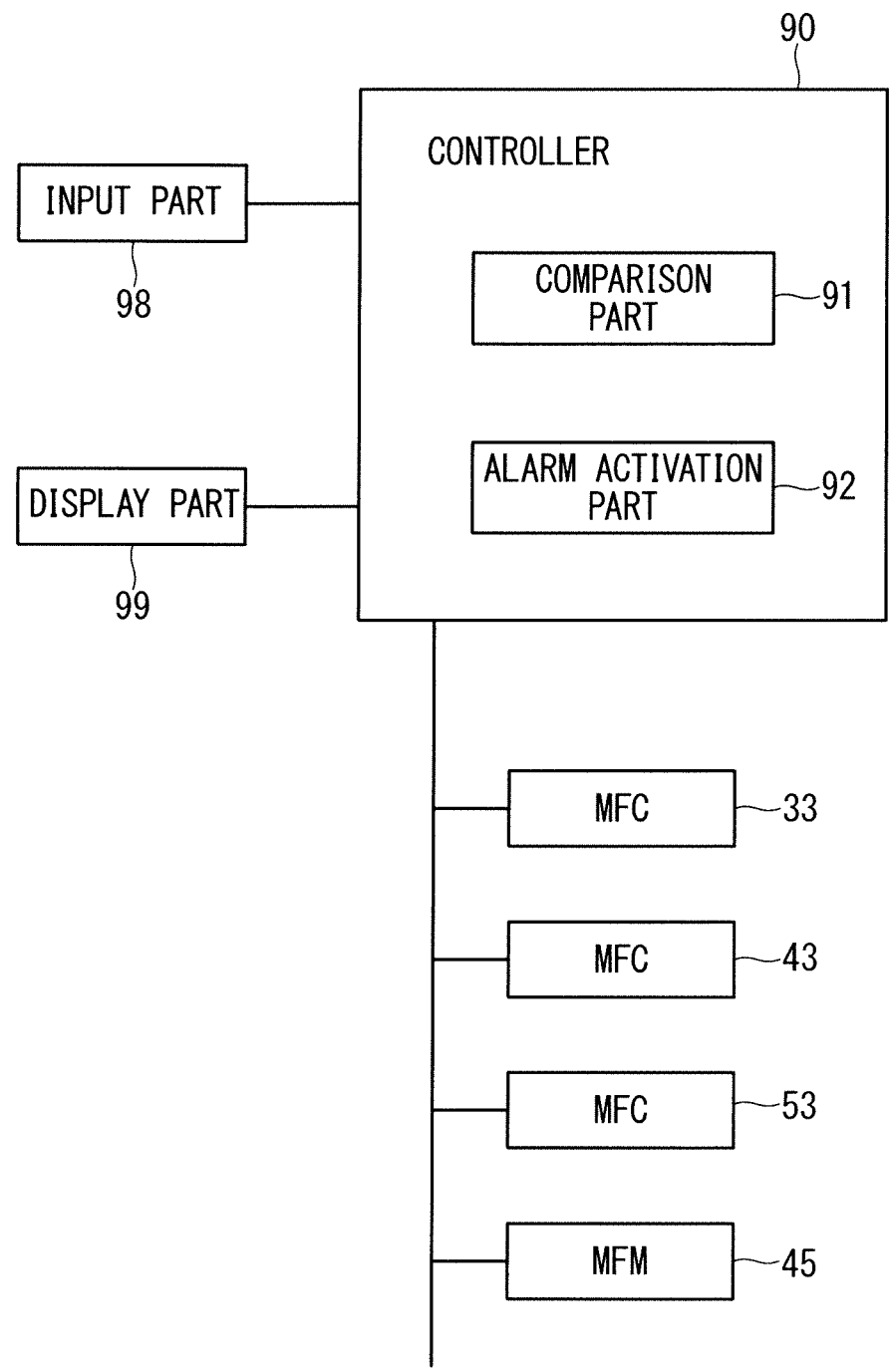
FIG. 4 is a block diagram illustrating a configuration of a controller.

Returning to FIG. 1, the controller 90 controls the aforementioned various operating mechanisms provided in the heat treatment apparatus 1. FIG. 4 is a block diagram illustrating a configuration of the controller 90. The controller 90 is similar in hardware configuration to a typical computer. That is to say, the controller 90 includes a CPU that is a circuit for performing various computation processes, a ROM which is a read-only memory for storing a basic program therein, a RAM which is a readable/writable memory for storing various pieces of information therein, and a magnetic disk for storing control application, data and the like therein. The CPU in the controller 90 executes a predetermined processing program, whereby the treatment in the heat treatment apparatus 1 proceeds.

As illustrated in FIG. 4, the controller 90 includes a comparison part 91 and an alarm activation part 92. The comparison part 91 and the alarm activation part 92 are each function processing part achieved by a CPU in the controller 90 executing a predetermined processing program. Processing details of the comparison part 91 and the alarm activation part 92 will be described in more detail below.

A first mass flow controller 33, a second mass flow controller 43, a third mass flow controller 53, a mass flow meter 45, and a valve provided in the gas supply part 20 are electrically connected to the controller 90. The controller 90 makes each mass flow controller control a gas flow amount to have a predetermined setting value, and obtains a measurement value of the mass flow meter 45. The controller 90 controls an opening and closing of each valve.

Furthermore, a display part 99 and an input part 98 are connected to the controller 90. The controller 90 displays various types of information on the display part 99. An operator of the heat treatment apparatus 1 can input various commands and parameters from the input part 98 while confirming the information displayed on the display part 99. A keyboard or a mouse, for example, can be used as the input part 98. A liquid crystal display, for example, can be used as the display part 99. In the present embodiment, a liquid crystal touch panel provided on an outer wall of the heat treatment apparatus 1 is adopted as the display part 99 and the input part 98 to double both functions.

Figure 5:
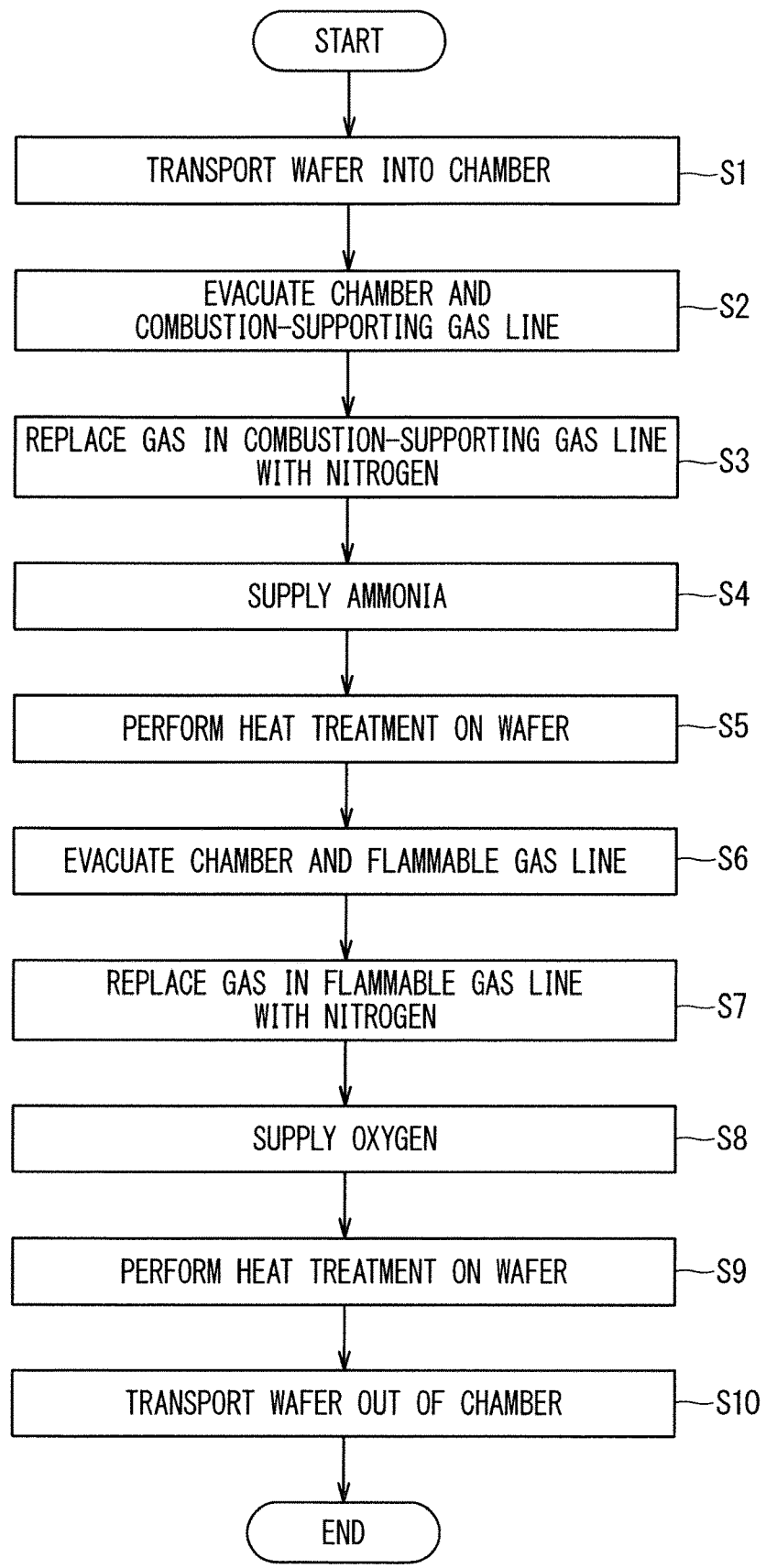
FIG. 5 is a flow chart illustrating a procedure of a treatment operation in the heat treatment apparatus.

A treatment operation in the heat treatment apparatus 1 is described next. FIG. 5 is a flow chart showing a procedure of the treatment operation in the heat treatment apparatus 1. Described mainly herein is a procedure of gas supply to the chamber 10 performed by the heat treatment apparatus 1.

Firstly, the semiconductor wafer W is transported into the chamber 10 (Step S1). The semiconductor wafer W to be treated is a silicon semiconductor wafer. The semiconductor wafer W is transported into the chamber 10 through the transport opening 14 by a transportation robot located out of the drawings and held by the susceptor 18. The transportation robot which has pass the semiconductor wafer W to the susceptor 18 moves out of the chamber 10, and the transport opening 14 is closed by a gate valve, thus the heat treatment space 15 in the chamber 10 becomes an enclosed space.

After the semiconductor wafer W is transported into the chamber 10, the chamber 10 and the combustion-supporting gas line 31 is evacuated (Step S2). In Step S2, the gas is exhausted by the vacuum pump 81 in a state where the valve 35 is opened and the valves 34, 44, 46, 54, and 26 are closed, thus the chamber 10 and a downstream side of the combustion-supporting gas line 31 in relation to the valve 34 are evacuated. The combustion-supporting gas line 31 is evacuated, thus oxygen remaining between the valve 34 and the valve 35 in the combustion-supporting gas line 31 is exhausted.

Next, the evacuation performed by the vacuum pump 81 is stopped, and the gas in the combustion-supporting gas line 31 is replaced with nitrogen (Step S3). In Step S3, the valve 54 is opened, thus nitrogen is supplied from the inert gas line 51 into the chamber 10, and nitrogen is also sent from the inert gas line 51 to the combustion-supporting gas line 31. Accordingly, the area between the valve 34 and the valve 35 in the combustion-supporting gas line 31 is filled with nitrogen, and oxygen remaining in the area between the valve 34 and the valve 35 is replaced with nitrogen. The gas in the combustion-supporting gas line 31 is replaced with nitrogen after the combustion-supporting gas line 31 is evacuated to reliably prevent mixture of ammonia which is the flammable gas and oxygen which is the combustion-supporting gas when ammonia is supplied in the subsequent process.

After the gas in the combustion-supporting gas line 31 is replaced with nitrogen, the valve 35 and the valve 54 are closed, and the chamber 10 is evacuated again by the vacuum pump 81. Subsequently, ammonia is supplied to the chamber 10 (Step S4). In Step S4, the valve 44 and the valve 46 are opened to supply ammonia from the flammable gas line 41 into the chamber 10. The gas in the combustion-supporting gas line 31 is replaced with nitrogen after the combustion-supporting gas line 31 is evacuated prior to supply of ammonia, thus mixture of ammonia to be supplied and oxygen from the combustion-supporting gas line 31 is reliably prevented.

At this time, from a viewpoint of preventing fire or explosion of ammonia which is the flammable gas, inflow of atmospheric air into the chamber 10 caused by a damage of constituent components of the chamber 10, for example, needs to be considered in addition to the mixture with oxygen from the combustion-supporting gas line 31. In the present embodiment, ammonia is attenuated by adding nitrogen so that a concentration of ammonia is smaller than an explosion limit to prevent the generation of explosive mixture gas also when atmospheric air is flowed in the chamber 10. Specifically, the valve 26 is opened and nitrogen is sent from the bypass line 25 to the flammable gas line 41. Accordingly, ammonia flowing in the flammable gas line 41 is mixed with nitrogen sent from the bypass line 25, thus ammonia is attenuated and supplied into the chamber 10.

A flow rate of ammonia and nitrogen is controlled by the second mass flow controller 43 and the third mass flow controller 53 so that the concentration of ammonia in the mixture gas of ammonia and nitrogen is smaller than the explosion limit when the mixture gas is supplied into the chamber 10. In the present embodiment, the mass flow meter 45 is provided in the flammable gas line 41 to monitor the flow rate of the mixture gas in order to reliably prevent a state where abnormality in a mixture ratio occurs by abnormality in the second mass flow controller 43 or the third mass flow controller 53, for example, and the concentration of ammonia is equal to or larger than the explosion limit.

The comparison part 91 of the controller 90 calculates a total value of a flow rate of ammonia controlled by the second mass flow controller 43 and a flow rate of nitrogen controlled by the third mass flow controller 53. The mass flow meter 45 measures a flow rate of mixture gas in which ammonia is mixed with nitrogen. The comparison part 91 compares the total value and a measurement value obtained by the mass flow meter 45. When the second mass flow controller 43 and the third mass flow controller 53 normally operate, the total value described above and the measurement value obtained by the mass flow meter 45 should coincide with each other. When the total value and the measurement value do not coincide with each other, it is considered that abnormality occurs in the second mass flow controller 43 or the third mass flow controller 53. Thus, when a difference between the total value described above and the measurement value obtained by the mass flow meter 45 is equal or larger than a preset threshold value as a result of comparison by the comparison part 91, the alarm activation part 92 of the controller 90 activates an alarm.

After the mixture gas of ammonia and nitrogen is supplied to the chamber 10 and an ammonia atmosphere is formed in the chamber 10, a heat treatment is performed on the semiconductor wafer W (Step S5). At the time of the heat treatment on the semiconductor wafer W, the halogen lamps HL of the halogen irradiation part 70 turn on, and preheating (assist heating) of the semiconductor wafer W is started. Light emitted from the halogen lamps HL is transmitted through the lower chamber window 12 and the susceptor 18 both made of quartz, and impinges on the lower surface of the semiconductor wafer W. By receiving light irradiation from the halogen lamps HL, the semiconductor wafer W is preheated, so that the temperature of the semiconductor wafer W increases. After a temperature of the semiconductor wafer W increases and reaches a predetermined preheating temperature, the temperature of the semiconductor wafer W is kept in the preheating temperature for several seconds.

The flash lamps FL in the flash irradiation part 60 irradiate a front surface of the semiconductor wafer W held by the susceptor 18 with a flash of light at a time when a predetermined time period has elapsed since the temperature of the semiconductor wafer W reaches the preheating temperature. The flash of light emitted from the flash lamps FL is an intense flash of light as a result of a conversion of electrostatic energy previously stored in a capacitor into an ultra-short light pulse. The flash of light is emitted for about 0.1 to about 100 milliseconds. The semiconductor wafer W is irradiated with such an intense flash of light for extremely a short time, thus the temperature of the front surface of the semiconductor wafer W is increased momentarily to a treatment temperature, and thereafter decreases rapidly. The preheating and the flash heating are performed on the semiconductor wafer W in the ammonia atmosphere, a thin film of silicon nitride ($Si_3N_4$) is formed on the front surface of the semiconductor wafer W.

When the flash heating treatment is finished, the halogen lamps HL are turned off after an elapse of a predetermined time. Accordingly, the temperature of the semiconductor wafer W decreases from the preheating temperature. Subsequently, the chamber 10 and the flammable gas line 41 are evacuated (Step S6). In Step S6, the value 44 and the valve 26 are closed, and the evacuation is performed by the vacuum pump 81, thus the chamber 10 and a downstream side of the flammable gas line 41 in relation to the valve 44 are evacuated. The flammable gas line 41 is evacuated, thus ammonia remaining on the downstream side of the flammable gas line 41 in relation to the valve 44 is exhausted.

Next, the evacuation performed by the vacuum pump 81 is stopped, and the gas in the flammable gas line 41 is replaced with nitrogen (Step S7). In Step S7, the valve 26 is opened, thus nitrogen is sent from the inert gas line 51 into the flammable gas line 41 via the bypass line 25, and nitrogen is supplied to the chamber 10 via the flammable gas line 41. Accordingly, the area between the valve 26 and the valve 46 and between the valve 44 and the valve 46 is filled with nitrogen, and ammonia remaining between the valve 44 and the valve 46 in the flammable gas line 41 is replaced with nitrogen. The gas in the flammable gas line 41 is replaced with nitrogen after the flammable gas line 41 is evacuated to reliably prevent mixture of ammonia which is the flammable gas and oxygen which is the combustion-supporting gas when oxygen is supplied in the subsequent process.

After the gas in the flammable gas line 41 is replaced with nitrogen, oxygen is supplied to the chamber 10 (Step S8). In Step S8, the valve 26 and the valve 46 are closed, and the valve 34 and the valve 35 are opened, thus oxygen is supplied from the combustion-supporting gas line 31 to the chamber 10. The gas in flammable gas line 41 is replaced with nitrogen after the flammable gas line 41 is evacuated prior to supply of oxygen, thus mixture of oxygen to be supplied and ammonia from the flammable gas line 41 is reliably prevented. When oxygen is supplied to the chamber 10, the valve 54 may be opened to supply mixture gas of oxygen and nitrogen to the chamber 10.

After oxygen is supplied to the chamber 10 and an oxygen atmosphere is formed in the chamber 10, a second heat treatment is performed on the semiconductor wafer W (Step S9). The heat treatment on the semiconductor wafer W in Step S9 is substantially the same as that in Step S5 described above. The preheating and the flash heating are performed on the semiconductor wafer W in the oxygen atmosphere, thus a thin film of silicon oxide ($SiO_2$) is formed as an underlayer of the silicon nitride film which has been previously formed.

After the second heat treatment on the semiconductor wafer W is completed, the halogen lamps HL are turned off, thus the temperature of the semiconductor wafer W decreases. The oxygen atmosphere in the chamber 10 is exhausted from the chamber 10 by the vacuum pump 81, and the valves 34 and 35 are closed and the valve 54 is opened, thus the gas in the chamber 10 is replaced with nitrogen. After the temperature of the semiconductor wafer W decreases to a predetermined temperature or less, the semiconductor wafer W on which the heat treatment has been performed is transported out of the chamber 10 via the transport opening 14, and the heat treatment is completed (Step S10).

In the present embodiment, nitrogen is sent from the inert gas line 51 to the combustion-supporting gas line 31 to replace the gas in the combustion-supporting gas line 31 into nitrogen, and nitrogen is also sent from the same inert gas line 51 to the flammable gas line 41 to replace the gas in the flammable gas line 41 into nitrogen. That is to say, the inert gas line is not individually provided in each of the combustion-supporting gas line 31 and the flammable gas line 41, however, one common inert gas line 51 is provided in the combustion-supporting gas line 31 and the flammable gas line 41. Accordingly, a space for arranging components relating to gas supply can be reduced.

The components relating to gas supply such as the mass flow controller provided in the combustion-supporting gas line 31, the flammable gas line 41, and the inert gas line 51 are integrated as a unit. Also according to this configuration, a space for arranging components relating to gas supply can be reduced.

While the preferred embodiments according to the present invention have been described hereinabove, various modifications of the present invention are possible in addition to those described above without departing from the scope and spirit of the present invention. For example, in the embodiment described above, ammonia is used as the flammable gas, however, the flammable gas is not limited thereto but may be hydrogen ($H_2$), for example. In the embodiment described above, oxygen is used as the combustion-supporting gas, however, the combustion-supporting gas is not limited thereto but may be ozone ($O_3$) or nitrogen monoxide ($N_2O$), for example. Furthermore, in the embodiment described above, nitrogen is used as the inert gas, however, the inert gas is not limited thereto but may be argon (Ar) or helium (He), for example.

In the embodiment described above, the filament-type halogen lamps HL are used as continuous lighting lamps that emit light continuously for not less than one second to preheat the semiconductor wafer W. The present invention, however, is not limited to this. In place of the halogen lamps HL, discharge type arc lamps (e.g., xenon arc lamps) may be used as continuous lighting lamps to perform the preheating.

The substrate to be treated by the heat treatment apparatus 1 is not limited to the semiconductor wafer, but a glass substrate used for a flat panel display in a liquid crystal display device, for example, or a substrate for a solar cell are also applicable.

In the embodiment described above, the semiconductor wafer W is irradiated with a flash of light in the chamber 10 to perform the heat treatment, however, the configuration is not limited thereto. The semiconductor wafer W housed in the chamber 10 may be irradiated with light from only the halogen lamps HL to perform the heat treatment.

While the invention has been shown and described in detail, the foregoing description is in all aspects illustrative and not restrictive. It is therefore understood that numerous modifications and variations can be devised without departing from the scope of the invention.

What is claimed is:
1. A heat treatment apparatus for heating a substrate, comprising:
    a chamber housing a substrate;
    a heating part performing a heat treatment on the substrate housed in the chamber;
    a combustion-supporting gas line supplying combustion-supporting gas to the chamber;
    a flammable gas line supplying flammable gas to the chamber; and an inert gas line sending inert gas to the combustion-supporting gas line to replace gas in the combustion-supporting gas line with the inert gas and sending inert gas to the flammable gas line to replace gas in the flammable gas line with the inert gas, wherein the inert gas line is provided in the combustion-gas line and the flammable gas line in common, wherein a first mass flow controller is provided in the combustion-supporting gas line, a second mass flow controller and a mass flow meter are provided in the flammable gas line, a third mass flow controller is provided in the inert gas line, and a plurality of apparatuses including the first mass flow controller provided in the combustion-supporting gas line is integrated as a combustion-supporting gas supply unit, a plurality of apparatuses including the second mass flow controller and the mass flow meter provided in the flammable gas line is integrated as a flammable gas supply unit, and a plurality of apparatuses including the third mass flow controller provided in the inert gas line is integrated as an inert gas supply unit, and at least the second mass flow controller and the mass flow meter are housed in an enclosure, and nitrogen is supplied into the enclosure.

2. The heat treatment apparatus according to claim 1, further comprising
a bypass line branched from the inert gas line and connected to the flammable gas line, wherein a terminal end of the combustion-supporting gas line is connected to the inert gas line, and the bypass line is connected to a midway portion of a route of the flammable gas line.

3. The heat treatment apparatus according to claim 2, wherein
when the flammable gas is supplied from the flammable gas line to the chamber, the inert gas is sent from the inert gas line to the flammable gas line via the bypass line.

4. The heat treatment apparatus according to claim 2, wherein
the bypass line is connected between the second mass flow controller and the mass flow meter.

5. The heat treatment apparatus according to claim 4, further comprising:
a comparison part comparing a total value of a flow rate of the flammable gas controlled by the second mass flow controller and a flow rate of the inert gas controlled by the third mass flow controller and a measurement value obtained by the mass flow meter; and
an alarm activation part activating an alarm when the total value and the measurement value do not coincide with each other.

6. The heat treatment apparatus according to claim 1, wherein
the flammable gas is ammonia or hydrogen, and
the combustion-supporting gas is oxygen, ozone, or nitrogen monoxide.

* * * * *